United States Patent [19]

Yoshida

[11] Patent Number: 5,017,803
[45] Date of Patent: May 21, 1991

[54] POWER SUPPLY POTENTIAL RISING DETECTION CIRCUIT

[75] Inventor: Masanobu Yoshida, Yokohama, Japan

[73] Assignee: Fujitsu Limited, Kawasaki, Japan

[21] Appl. No.: 321,779

[22] Filed: Mar. 10, 1989

[30] Foreign Application Priority Data

Mar. 16, 1988 [JP] Japan .................. 63-060214

[51] Int. Cl.⁵ .................. H03K 5/00; H03K 17/687; G11C 11/34
[52] U.S. Cl. .................. 307/296.5; 307/571; 307/594; 365/185
[58] Field of Search ............... 307/296.5, 238.5, 296.1, 307/590, 594, 605, 571; 365/185

[56] References Cited

U.S. PATENT DOCUMENTS

4,245,165 1/1981 Hoffman ............... 307/296.5
4,742,492 5/1988 Smayling et al. ............ 307/296.5

Primary Examiner—Stanley D. Miller
Assistant Examiner—Trong Phan
Attorney, Agent, or Firm—Staas & Halsey

[57] ABSTRACT

A power supply potential rising detection circuit comprises a transistor having a control gate and a floating gate, connected in series with a load element between first and power supply terminals. A first potential is applied to the control gate, the first potential being dependent on the power supply potential at the first power supply terminal. A switching element is operatively connected to the floating gate and controlled by a second potential dependent on the power supply potential, and reduces the potential of the floating gate and turns off the transistor when the power supply potential reaches a predetermined value, thereby outputting a power supply potential rising detection signal from the series connection point between the load element and the transistor.

6 Claims, 10 Drawing Sheets

POWER SUPPLY POTENTIAL RISING DETECTION CIRCUIT

BACKGROUND OF THE INVENTION

1. Field of the Invention

The present invention relates to a power supply potential rising detection circuit and especially relates to a circuit for generating a reset pulse when a rise in a power supply potential is detected at a power on time, i.e., a power-on reset circuit.

2. Description of the Related Art

In a semiconductor integrated circuit such as a semiconductor memory circuit, for example, a circuit for generating a reset pulse by detecting a rise of a power supply potential, i.e., a power-on reset circuit, is usually provided on the same chip to initialize the potential of each node portion thereof at a power on time.

Figure 1:
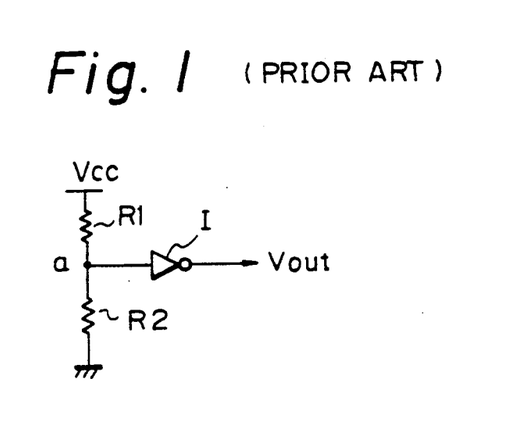
FIG. 1 shows a circuit of one example of a conventional power supply potential rising detection circuit.
Figure 2:
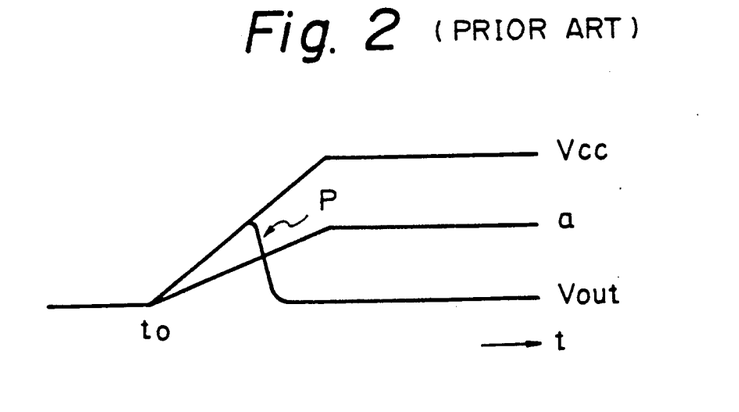
FIG. 2 shows a timing chart illustrating the operation of the circuit shown in FIG. 1.

In the conventional technology, a circuit in which the power supply potential is divided by resistors $R_1$ and $R_2$ and the potential thus derived (the potential at node a) is input to an inverter I as shown in FIG. 1, is known as one kind of such a power supply potential rising detection circuit In FIG. 2, the variation of the potential at each node portion in the circuit shown in FIG. 1 is illustrated and each curve $V_{cc}$, a, and $V_{out}$ represents a variation of the power supply potential at a power on time, a variation of the potential at the node a, and a variation of the output potential of the inverter I, respectively.

When power is supplied to this circuit at the time $t_0$, the output potential of the inverter $V_{out}$ initially increases along with the rise of the power supply potential $V_{cc}$, but when the potential of the node a reaches the threshold potential of the inverter I, the inverter output potential $V_{out}$ is inverted to low level and thereby a pulse P indicating the detection of the rise in power supply potential can be obtained.

However, in the circuit shown in FIG. 1, a problem arises in that power consumption is increased because of the steady current flowing through the resistors $R_1$ and $R_2$ and the inverter I after the time $t_0$.

The inverter I dissipates the power, since the potential of input signal is at an intermediate level between the ground potential and the power supply potential $V_{cc}$.

Figure 3:
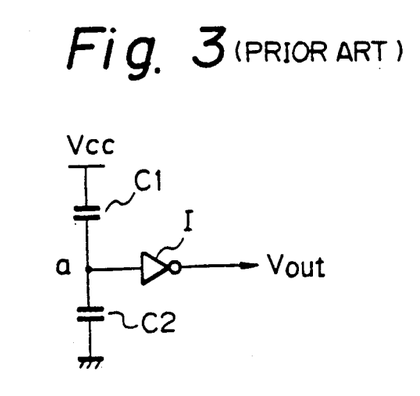
FIG. 3 shows other example of a conventional power supply potential rising detection circuit.

Another circuit shown in FIG. 3, is also known in which a power supply potential $V_{cc}$ is divided by capacitors $C_1$ and $C_2$ and the potential thus derived is input to an inverter I.

In this circuit, an output pulse P indicating the detection of a rise in power supply potential can be obtained by the same operation as shown in FIG. 2.

In this case, there is some decrease in power consumption compared with the circuit of FIG. 1 because steady current only flows through the inverter I. However, it is necessary for capacitors $C_1$ and $C_2$ to have a large capacitance in order to overcome the effect of stray capacitance.

This type of capacitor is usually formed of a poly-silicon layer on a diffusion layer provided on the surface of a semiconductor substrate with an insulating film therebetween, but in order to increase the capacitance of this capacitor, it is necessary to enlarge the area of said diffusion layer.

Therefore, for example, when stray light energy entering a window provided on an EPROM (electrically programmable ROM) for erasure, irradiates the diffusion layer, a leakage current will flow from the diffusion layer, comprising one electrode of the capacitor, to the semiconductor substrate and thereby another problem arises in which the potential at the node a formed by the capacitors $C_1$ and $C_2$ will reach an abnormal potential thereby causing the circuit to mistakenly operate.

Figure 4:
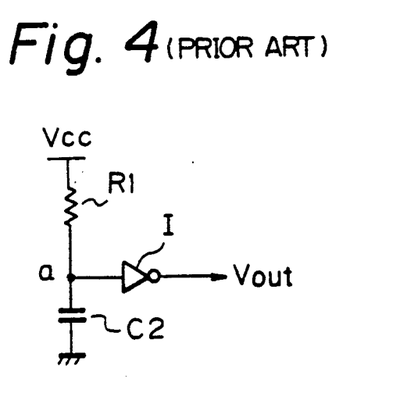
FIG. 4 shows another example of a conventional power supply potential rising detection circuit.

In another known circuit of this type, shown in FIG. 4, a power supply potential $V_{cc}$ is divided by a time constant circuit comprising a resistor $R_1$ and a capacitor $C_2$, and the potential thus derived is input to an inverter I.

Figure 5A:
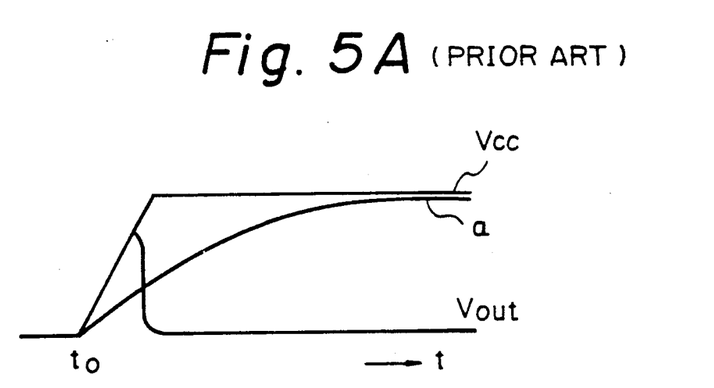
FIGS. 5A to 5C show timing charts illustrating the operation of the circuit shown in FIG. 4.

In this circuit, as shown in FIG. 5A, the output potential $V_{out}$ can correctly indicate the detection of a rising power supply potential when the power supply potential $V_{cc}$ is rapidly rises.

Figure 5B:
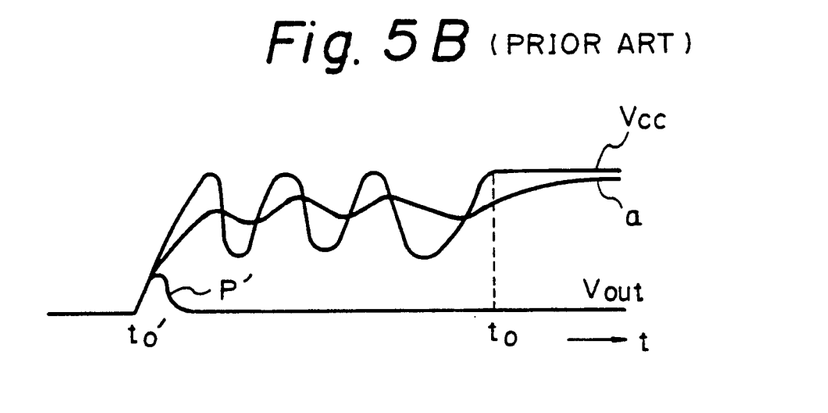

However as shown in FIG. 5B, when there is a fluctuation in the power supply potential $V_{cc}$ at a power on time, a condition in which the potential of the node a has already increased beyond the threshold potential of the inverter I, due to the capacitor $C_2$ being charged at the time $t_0$, when the power supply potential is still in an unstable condition, will occur and therefore, at the time $t_0$, when the power supply potential is still unstable, only an output pulse P' is generated, and the pulse P indicating detection of the power supply potential rising is not output at the time $t_0$ when the power supply potential $V_{cc}$ has reached a stable condition.

Figure 5C:
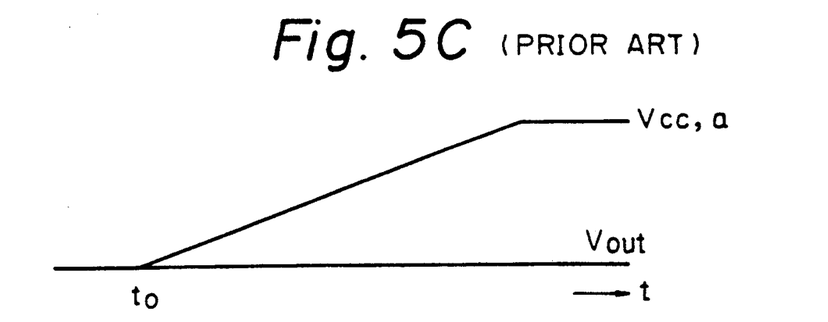

Further, as shown in FIG. 5C, when the power supply potential $V_{cc}$ rises gradually at the same rate as that of the time constant of $R_1C_2$, a further problem arises in that the power supply potential and the potential of the node portion a overlap so that no pulse P indicating detection of the power supply potential rise is output.

Figure 6:
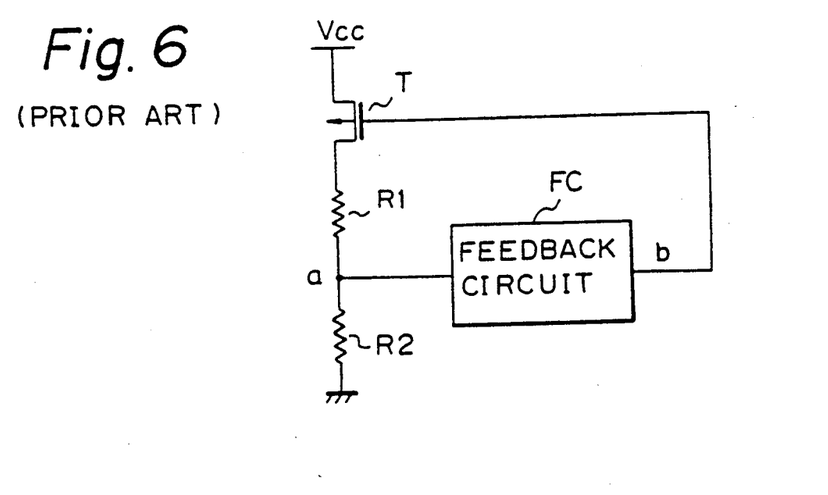
FIG. 6 shows another example of a conventional power supply potential rising detection circuit.

In addition to the above, as shown in FIG. 6, an improvement on the circuit shown in FIG. 1 is also known in which a feedback circuit FC and a transistor T controlled by the Feedback circuit FC are provided.

Figure 7:
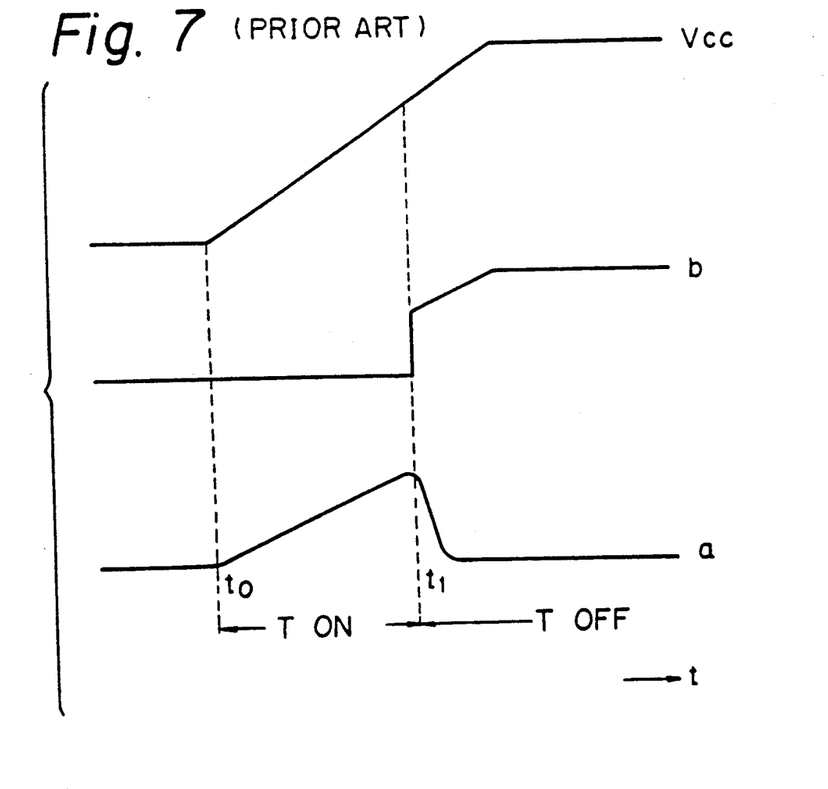
FIG. 7 shows a timing chart illustrating the operation of the circuit shown in FIG. 6.

The feedback circuit FC operates in such a way that, as shown in FIG. 7, initially from the power on time $t_0$ to the time $t_1$, the feedback circuit FC outputs a voltage b having a low level turning the P channel transistor T ON, and when the feedback circuit FC detects the increase in power supply potential $V_{cc}$ at the time $t_1$, by detecting the potential of node a which increases as the power supply potential $V_{cc}$ increases, the output voltage b is latched at a high level so that the P channel transistor T is turned OFF and the potential of the node a is returned to a low level.

In the above circuit, the power consumed by the resistors $R_1$ and $R_2$ can be reduced, although another problem arises in that the construction of the circuit including the feedback circuit becomes more complicated.

SUMMARY OF THE INVENTION

The present invention was created to solve on the technical problems explained above. The object of this invention is to provide a power supply potential rising detection circuit having a relatively simple construction but having sophisticated performance enabling it to operate accurate)y with reduced power consumption even if the diffusion layer of an EPROM is irradiated by stray light or when the increase in power supply potential is unstable at a power on time.

To attain the above object, in accordance with the present invention, there is provided a power supply potential rising detection circuit comprising a first and a second power supply terminals; a load element; a transistor having a control gate and a floating gate, the transistor being connected to the load element in series between said first and second power supply terminals; a means for supplying a first potential to the control gate, the first potential being dependent on the power supply potential at the first power supply terminal; and a switching element operatively connected to the floating gate and controlled by a second potential which is dependent on the power supply potential, for reducing the potential of the floating gate and turning off the transistor when the power supply potential reaches a predetermined value, thereby outputting a power supply potential rising detection signal from the connecting point between the load element and the transistor.

DESCRIPTION OF PREFERRED EMBODIMENTS

Figure 8:
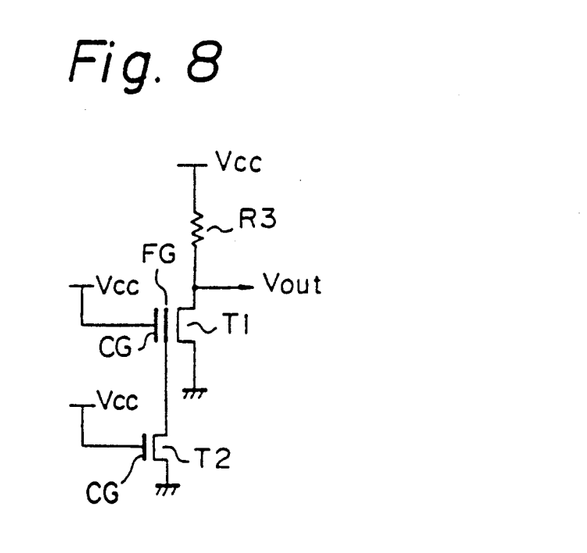
FIG. 8 shows a basic construction of a power supply potential rising detection circuit of the present invention as one example.

FIG. 8 shows a basic construction of a power supply potential rising detection circuit of the present invention as one example with a transistor T1 having a floating gate FG and a control gate CG, transistor T1 having the same construction as that of a memory cell transistor usually used for an EPROM.

The drain of the transistor T1 is connected to a power supply terminal $V_{cc}$ through a load resistor $R_3$, while the source thereof is connected to a ground terminal.

The control gate CG is connected to the power supply terminal $V_{cc}$ while the floating gate FC is connected to the drain of an enhancement type metal-insulator semiconductor (MIS) transistor T2. The gate of the enhancement type MIS transistor T2 is connected to the power supply terminal $V_{cc}$ and the source thereof is connected to a ground terminal. Thus, an output potential $V_{out}$ can be obtained at the connection point formed by the drain of the transistor T1 and the load resistor $R_3$.

Figures 9A, 9B:
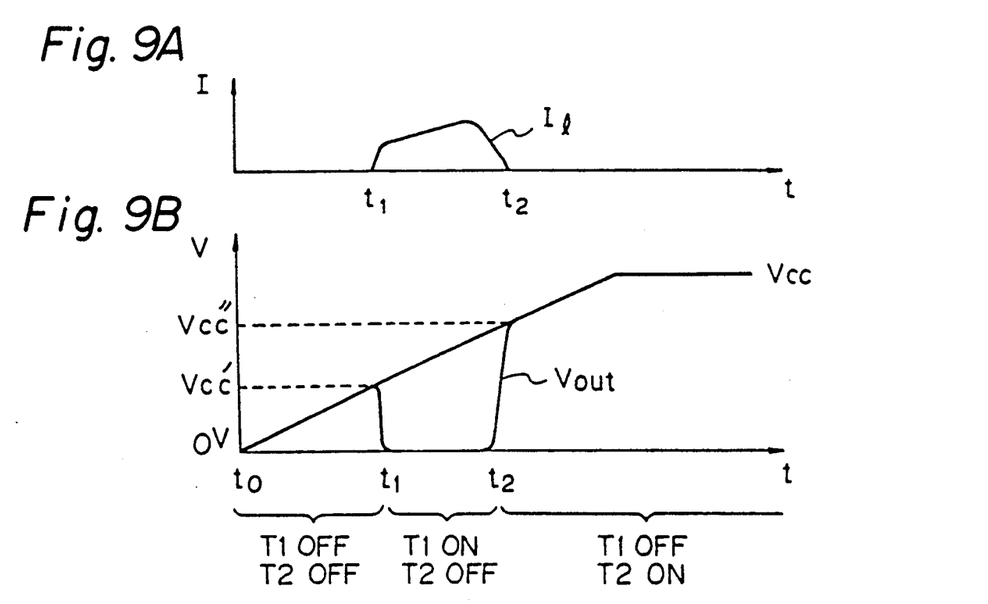
FIG. 9A and 9B show a timing charts of current and voltage conditions illustrating the operation of the circuit shown in FIG. 8.

In the circuit explained above, when a power supply potential is applied to this circuit at the time $t_0$, and thereafter the power supply potential $V_{cc}$ is gradually increased from a $V \times 0$ level, both of the transistors T1 and T2 are in an OFF state during the initial time (from the time $t_0$ to the time $t_1$), and accordingly the output potential $V_{out}$ increases as the power supply potential increases, as shown in FIG. 9B.

As mentioned above, when the transistor T2 is OFF, the floating gate FG of the transistor T1 is in a floating condition, and therefore, the potential of the floating gate FG will be at a level of for example $0.5 = V_{cc}$ due to the coupling of the capacitance between the floating gate FG and the controlling gate CG, and the capacitance between the floating gate FG and the channel.

In this condition, when the power supply potential $V_{cc}$ reaches the threshold voltage $V_{cc}$, of the transistor T1, the transistor T1 is turned ON at time $t_1$, and the output potential $V_{out}$ thereof becomes approximately 0 V. However, in this case, the transistor T2 is still in an OFF condition at the time $t_1$, because the threshold voltage $V_{cc}'$ of the transistor T1 is below the threshold voltage $V_{cc}''$ of the enhancement type MIS transistor T2.

When the power supply potential $V_{cc}$ has further risen and reaches the threshold voltage $V_{cc}''$ of the transistor T2, the enhancement type MIS transistor T2 is turned ON at the time $t_2$, and thereby the potential of the floating gate FG becomes 0 V, and the transistor T1 is turned OFF.

Thus the rise of the power supply potential can be detected by the transistor T1 being turned OFF and the output voltage $V_{out}$ being increased to a high level (the same level as that of the power supply potential).

As mentioned above, the transistor T1 is only turned ON from the time $t_1$ when the power is applied, to the time $t_2$, and is turned OFF after the time $t_2$.

Therefore, in the circuit shown in FIG. 8, the time in which the electric current Il can flow through the load resistance $R_3$ and the transistor T1 is very short, as shown in FIG. 9A, and thereby the power consumption of this circuit is remarkably reduced.

And further, in the circuit as shown in FIG. 8, though a stray capacitance exists between the floating gate FG of the transistor T1 and the substrate, the size of the transistor T2 connected to the floating gate FG can be made extremely small with the area of the drain diffusion layer thereof also being extremely small and consequently, even if light is irradiated on the drain diffusion layer of the transistor T2, the leakage current caused by the irradiation of the light will be very small and thus will not affect the potential of the floating gate FG.

Therefore, in the circuit of the present invention, none of the problems mentioned above will arise even if there is capacitive coupling.

Figure 10:
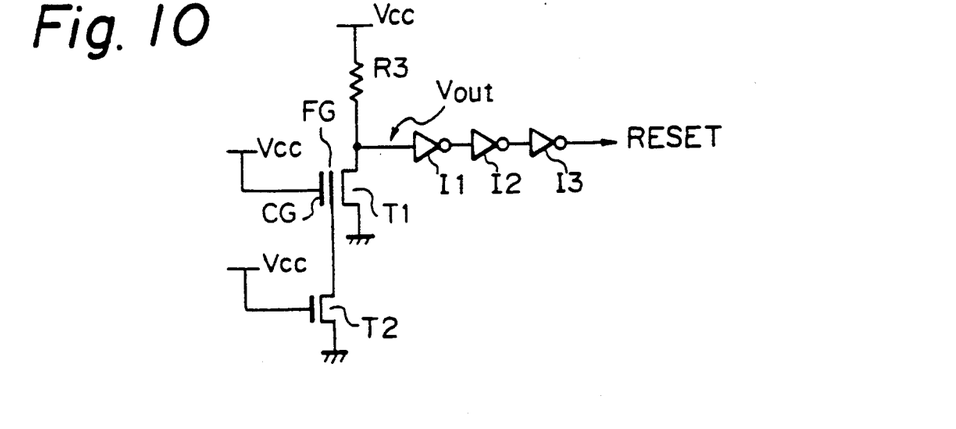
FIG. 10 shows a circuit construction modified from the circuit shown in FIG. 8 for application to a power-on reset circuit as another example.
Figure 11A:
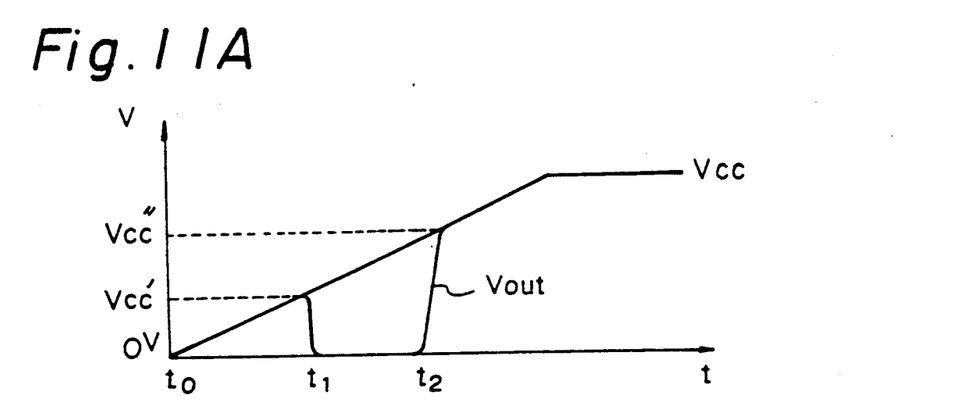
FIGS. 11A and 11B show a timing chart illustrating the operation of the circuit shown in FIG. 10.
Figure 11B:
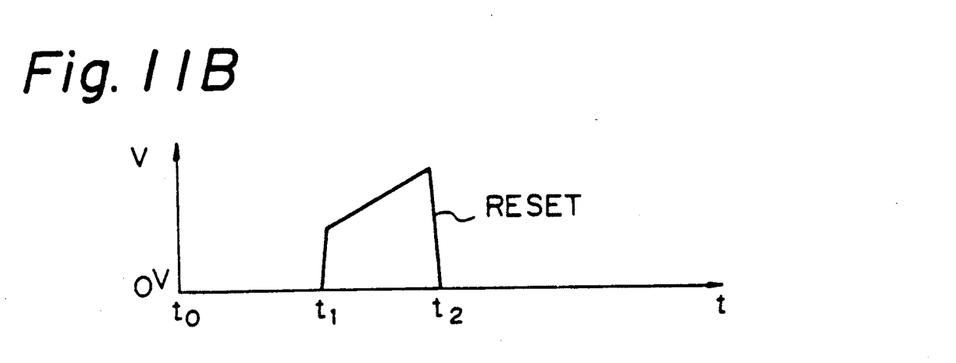

FIG. 10 shows a circuit construction modified from the circuit shown in FIG. 8 for application to a power-on reset circuit as another example of the present invention. In this circuit, the level of the output voltage $V_{out}$ as mentioned above (refer to FIG. 11A), output from the connection point between the load resistance $R_3$ and the transistor T1, is inverted through inverters I1, I2 and I3, and the reset pulse RESET as shown in FIG. 11B can be obtained from the output of the inverter I3.

Figure 12:
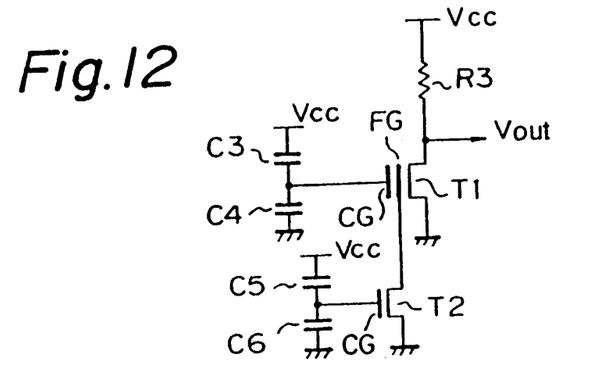
FIG. 12 shows another circuit construction also modified from the circuit shown in FIG. 8 as another example of this invention.

FIG. 12 shows another example of the power supply potential rising detection circuit of the present invention in which a divided potential obtained by dividing the power supply potential $V_{cc}$ by capacitors $C_3$ and $C_4$, and by capacitors $C_5$ and $C_6$, is applied to the control gates CG of the corresponding transistors T1 and T2.

The circuit as described above can be used when the threshold voltage of both of the transistors T1 and T2 is low.

Figure 13:
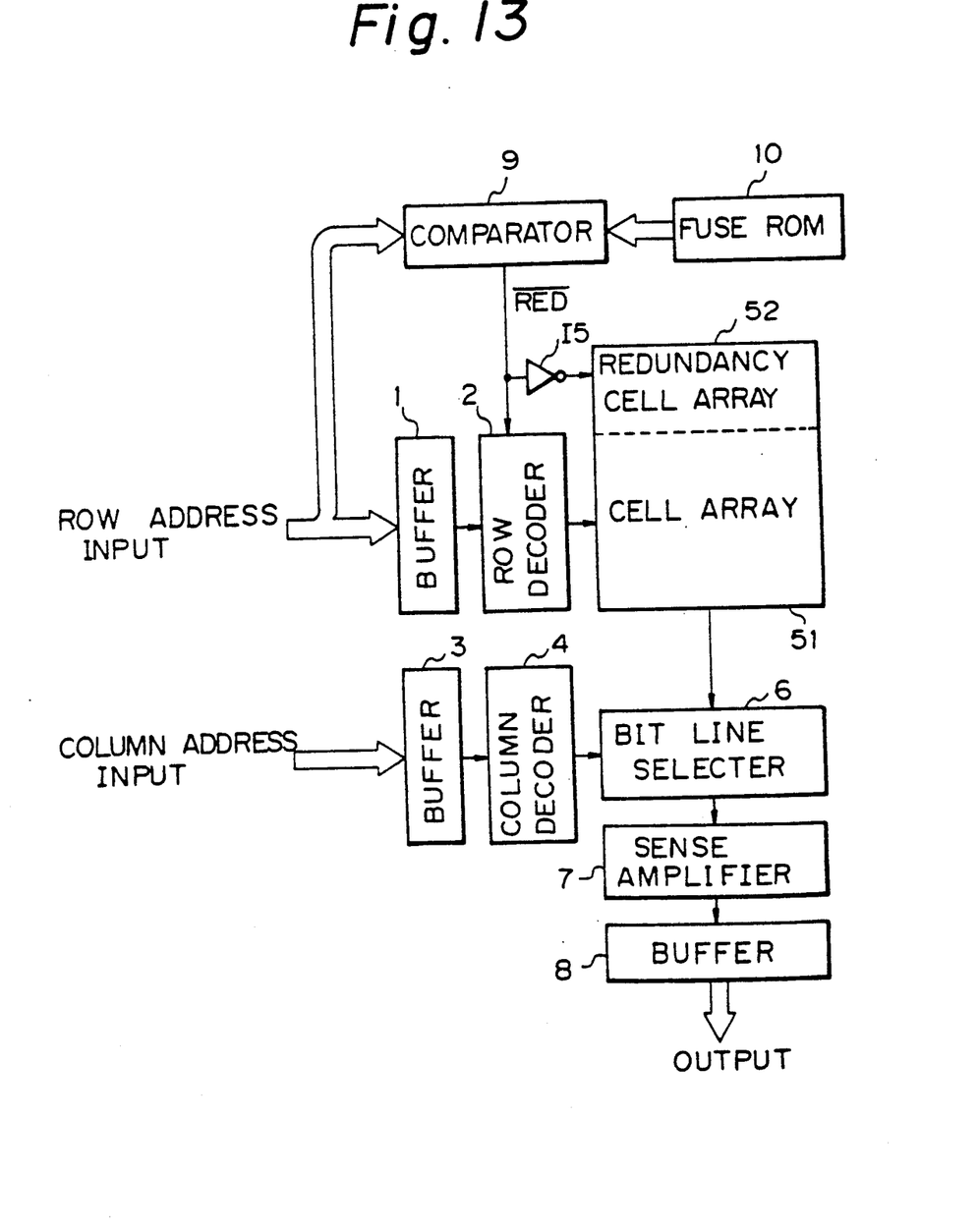
FIGS. 13 to 15 show circuitry in which the reset circuit is applied to an EPROM having a redundant circuit construction as one form of application of the power-on reset circuit, with FIG. 13 showing a block diagram indicating the complete construction of the EPROM, FIG. 14 showing a constructive embodiment of a comparator and a fuse ROM as shown in FIG. 13, and FIG. 15 showing a constructive embodiment of a portion of the block diagram shown in FIG. 13, excluding the comparator and fuse ROM.
Figure 14:
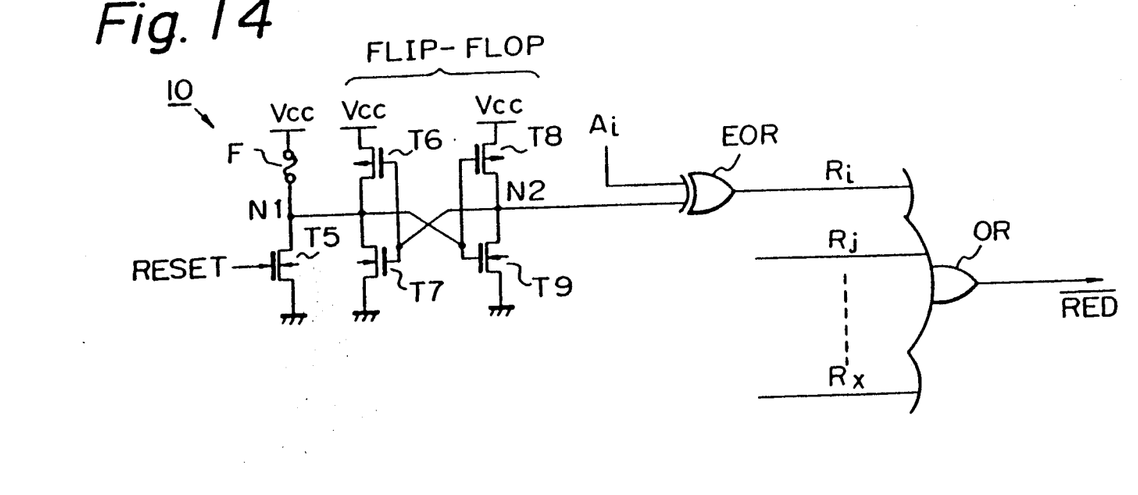
Figure 15:
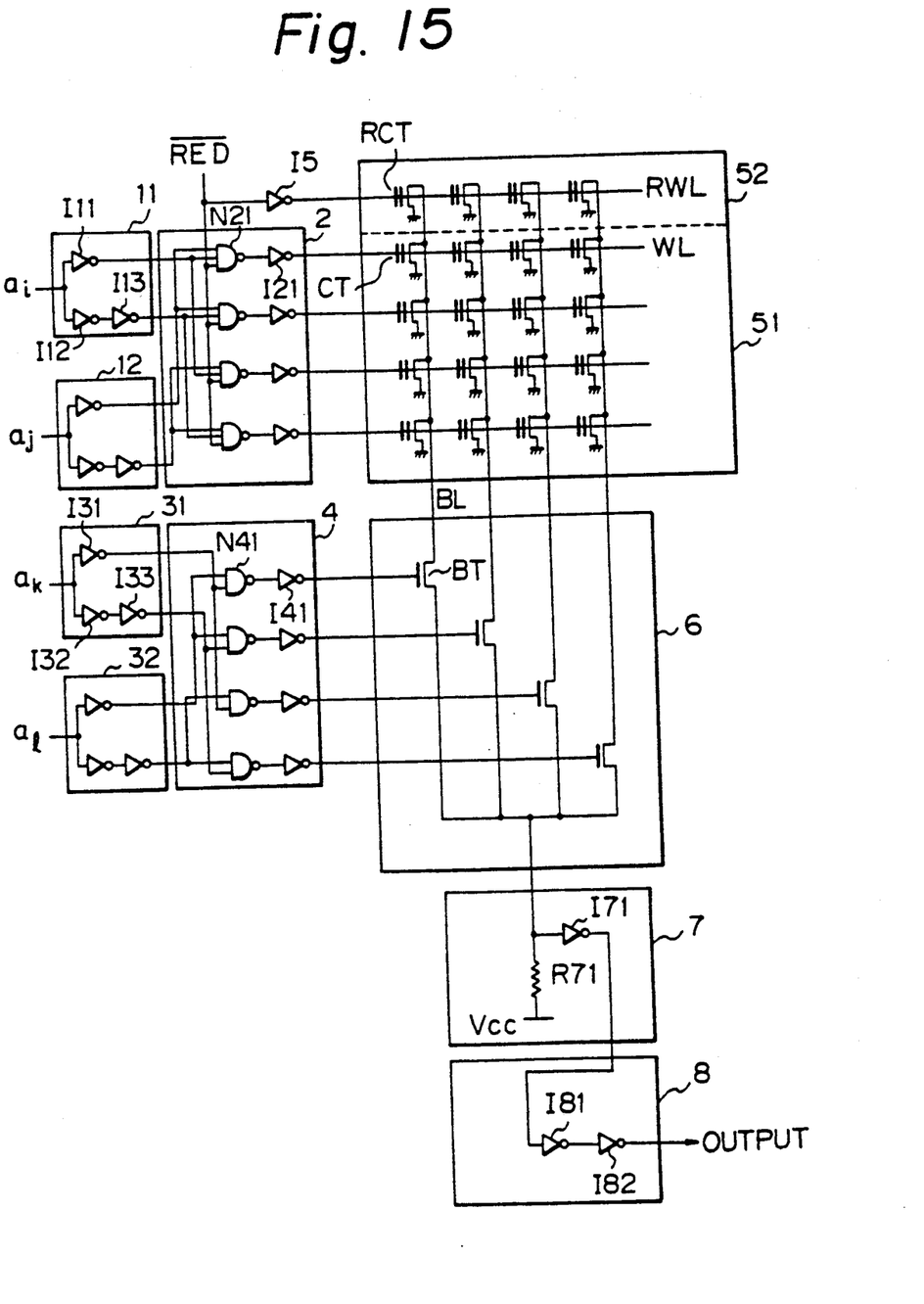

FIGS. 13 to 15 show circuitry in which the power-on reset circuit of the present invention is applied to an EPROM having a redundant circuit construction as one embodiment of the power-on reset circuit of this invention, and FIG. 13 shows a block diagram indicating the complete construction of the EPROM.

Namely, in FIG. 13, reference numeral 1 is an address buffer circuit for waveform-shaping a row address signal, 2 is a row decoder for selecting a predetermined word line provided in a memory cell array 51 corresponding to the row address signal input from the address buffer circuit 1, 3 is an address buffer circuit for waveform-shaping a column address signal, 4 is a column decoder for supplying a predetermined selecting signal to a bit line selector 6 corresponding to a column address signal input from the address buffer circuit 3, the bit line selector 6 selecting a predetermined bit line corresponding to the selecting signal output from the column decoder 4, 7 is a sense amplifier and 8 is an output buffer circuit 8, and the signal read out from the selected memory cell transistor in the cell array is output by the output buffer circuit 8.

A fuse ROM 10 is also provided and in the fuse ROM 10, a row address corresponding to a malfunctional memory cell is stored while the row address input to the address buffer 1 is compared with the address stored in the fuse ROM 10.

Thereafter, the redundant signal RED output from the comparator 9, changes to a low level when the input address coincides with the address stored in the fuse ROM 10, and thereby all of the word lines provided in the cell array 51 are deselected by the row decoder 2 and simultaneously the word line provided in a redundancy cell array 52 is selected through an inverter 15.

FIG. 14 shows an actual construction of a fuse ROM 10 corresponding to one bit of the row address in the EPROM (for example $A_j$), and a comparator.

Namely, in FIG. 14, power is supplied to this circuit, the N channel transistor T5 is turned ON for a moment by a reset pulse RESET output from the power-on reset circuit of the present invention, and thereby when a fuse F is disconnected, the potential of a node N1 changes to a low level causing the potential of the output node N2 of the flip-flop, comprising P channel transistors T6 and T8 and N channel transistors T7 and T9, to change to a high level.

This condition can be maintained even after the reset pulse RESET is extinguished and the transistor T5 is turned OFF.

On the other hand, when the fuse is still intact, the voltage of the node N1 changes to a low level for a moment when the reset pulse RESET is input thereto, returning to a high level immediately after that time, and the potential of the node N2 changes to a low level.

As mentioned above, the level of the potential of the node N2 can be set in accordance with whether the fuse is intact or not, only by inputting the reset pulse RESET at a power on time.

According to the above circuit, the stable current which flows if the fuse is intact when using a pull down resistor instead of the transistor T5, never flows in this circuit and thereby the electric power consumption is reduced.

As mentioned above, the potential of the node N2 set by the fuse ROM is compared with the potential of the row address input $A_i$ by an Exclusive OR circuit EOR, and when both potential levels coincide with each other a low level signal $R_i$ is output from the circuit EOR.

In a similar manner, for each row address input $A_j$ —$A_x$, the level of the potential of each of the other bits of the row address input is respectively compared with the level of the potential stored in each corresponding fuse ROM, and when all of the output signals $R_i$, $R_j$—$R_x$ output from all of the corresponding comparator (i.e., Exclusive Or) circuits (EOR) are at a low level (i.e., when each potential level of all bits of the row address input coincides with the level of the potential stored in each corresponding fuse ROM), a redundancy signal RED having a low level is output from the OR circuit OR, and accordingly the redundancy cell array is selected in the same manner as explained above.

FIG. 15 shows a specific embodiment of a portion of the EPROM of FIG. 13, excluding the fuse ROM and the comparator, and the components that are common to those of FIG. 13 carry the same numerals as used in FIG. 13.

In FIG. 15, address buffers 11 and 12 which correspond to the row address signals $a_i$ and $a_j$ respectively, are provided and the row address signal $a_i$ and its inverted signal are waveform-shaped by inverters I11, I12, and I13, for example, and further a 2-input 4-output row decoder 2, comprising a NAND gate N21 and an inverter I21, is provided.

When the redundancy signal RED output from the comparator is at a high level, a predetermined word line WL in the memory cell array 51 is selected whereas when the redundancy signal RED is at a low level, a redundancy word line RWL in the redundancy cell array 52 is selected.

On the other hand, address buffers 31 and 32 corresponding to the address signals $a_k$ and $a_l$ respectively are provided, and a 2-input 4-output column decoder 4, comprising NAND gate N41 and inverter I41, is also provided. A predetermined transistor BT provided in a bit line selector 6 is turned ON with the selecting signal output from the column decoder 4.

As explained above, the data stored in a memory cell transistor CT or a redundancy memory cell transistor RCT corresponding to the selected word line WL or selected bit line BL, respectively, can be read from the output thereof through the sense amplifier 7 comprising a pull up resistor R71 and an inverter I71, and the output buffer 8 comprising inverters I81 and I82.

The transistor T1 provided in the power-on reset circuit of the present invention has the same construction as that of the memory cell transistor CT or redundancy memory cell transistor RCT in the EPROM above, (i.e., having both a floating gate and a control gate) and therefore these transistors can be made by the same process.

Figure 16A:
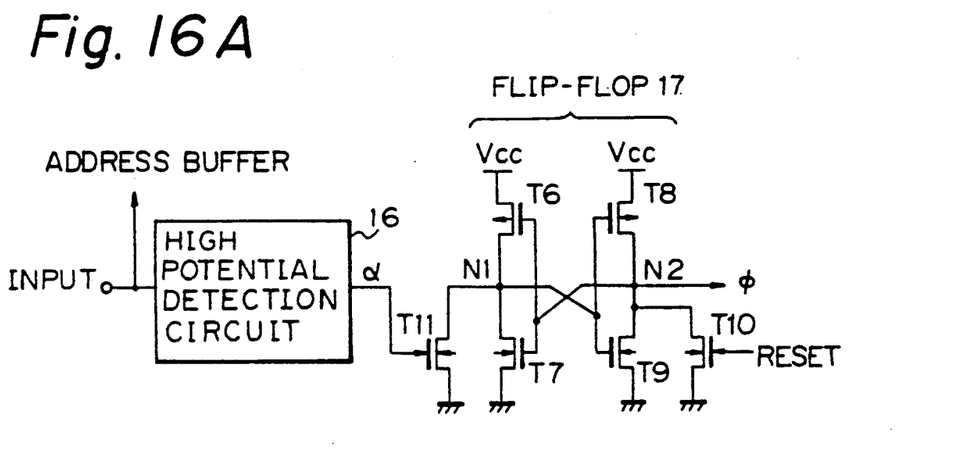
FIGS. 16A to 16C show a circuit construction in which the reset circuit is applied to a test circuit of a memory device as an example of a second application of the power-on reset circuit.
Figure 16B:
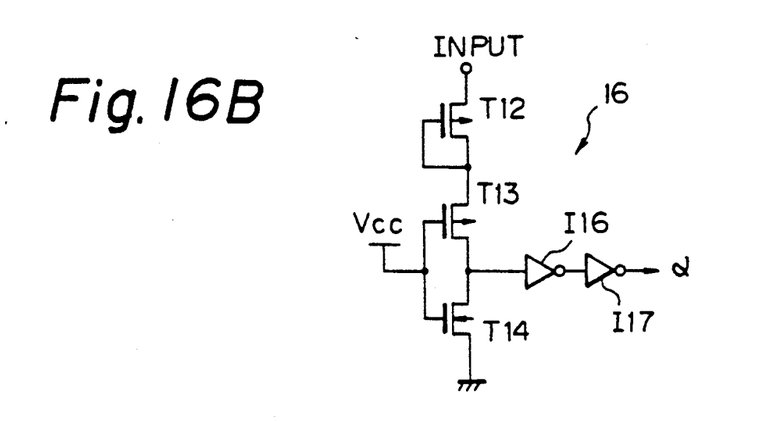
Figure 16C:
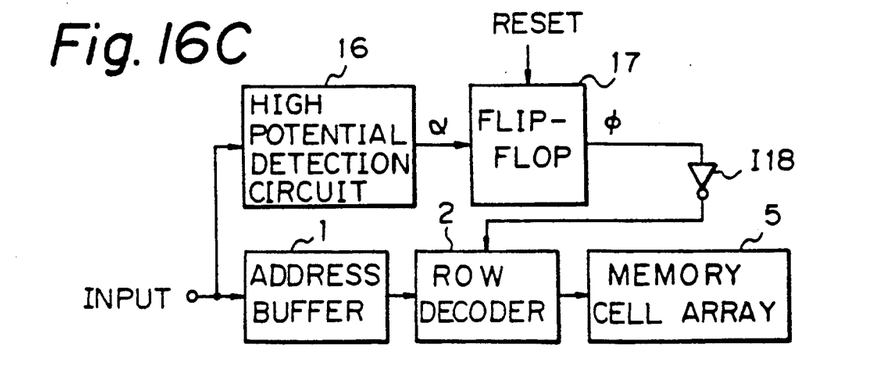

FIGS. 16A to 16C show a circuit construction in which the power-on reset circuit is applied to a memory device test circuit as an example of a second embodiment of the power-on reset circuit.

In FIG. 16A, a high potential detection circuit 16 is provided, and when a memory device is used in a test mode, a high potential, for example 12.5 V, is briefly applied to the high potential detection circuit 16.

In this situation, one of the input terminals for address signal input can be used as an input terminal for the high potential detection circuit 16, and when this device is used in the test mode, a high potential that is higher than that usually applied to the input terminal is briefly applied thereto.

In the circuit as shown in FIG. 16A, at the power-on time, the N channel transistor T10 is first turned ON briefly by the reset pulse RESET output from the power-on reset circuit, and thereby the level of the potential of the node N2 becomes low, causing the level of the potential of the node N1 to become high due to the function of the flip-flop 17 comprising of transistors T6 to T9.

At this time, the level of the potential of the output signal a output from the high potential detection circuit 16 becomes low causing the N channel transistor T11 to turn OFF.

The level of the potential of the test signal φ output from the node N2 is maintained at a low level even after the transistor T10 is turned OFF, as long as the transistor T11 is not turned ON.

Next, when the memory device is used in the test mode, a high potential for example 12.5 V, is first briefly applied to the input terminal of the high potential detection circuit 16 as described above.

Therefore, the level of the potential of the output signal a output from the high potential detection circuit 16 becomes high causing the transistor T11 to turn ON briefly and consequently, the level of the potential of the node N1 becomes low causing the level of the potential of the node N2 become high due to the function of a flip-flop 17. At this time the transistor T10 is turned OFF.

The level of the potential of the test signal φ output from the node N2 is maintained at a high level due to the above condition being maintained by the flip-flop 17 even after the transistor T11 is turned OFF.

As described above, in the present invention, the test mode can be maintained by only applying a brief high potential to the input terminal of the high potential detection circuit 16 to latch the level of the potential of the test signal φ at a high level due to the function of the flip-flop 17 provided in this circuit as mentioned above, and thus the flexibility of the test of the memory circuit can be improved since one of the input terminals to which the address signal is always input, for example, can be used as the input terminal for the high potential detection circuit 16.

FIG. 16B shows a specific embodiment of the construction of the high potential detection circuit 16 as mentioned above, and in which an address signal (about 0 V to 5 V) for example is usually input to the input terminal thereof in normal operation.

At that time, P channel transistors T12 and T13 are OFF while N channel transistor T14 is ON causing the level of the potential of the output, signal a output through the inverters I16 and I17, to change to a low level.

On the other hand, in the test mode, a high potential for example 12.5 V, is briefly applied to input terminal, and thereby the P channel transistors T12 and T13 are turned ON while the conductance of the N channel transistor T14 is reduced.

As a result, the potential of the output signal a output through the inverter I16 and I17 changes to a high level.

FIG. 16C illustrates the connection relationship between the test circuit and the memory device as an example of the present invention and the high potential detection circuit 16 and flip-flop 17 in this Figure correspond to their counterparts shown in FIG. 16A.

In the device as shown in FIG. 16C, the address signal is input into the address buffer 1 from the input terminal thereof during normal operation and, although the address signal is also applied to the high potential detection circuit 16, the memory device works in the normal mode since at that time, the level of the potential of the output signal a is low as explained above.

When a high potential is briefly applied to the input terminal above, the level of the potential of the output signal a of the high potential detection circuit 16 becomes high for a moment, and the level of the potential of the test signal φ is latched at a high level.

Thereafter, the high level of the potential of the test signal φ is inverted to a low level by an inverter I18 and is then input into the decoder 2.

Accordingly, all of the word lines provided in the memory cell array 5 are not selected and under that condition, a test can be carried out to detect a mulfunctional memory cell, for example.

Figure 17:
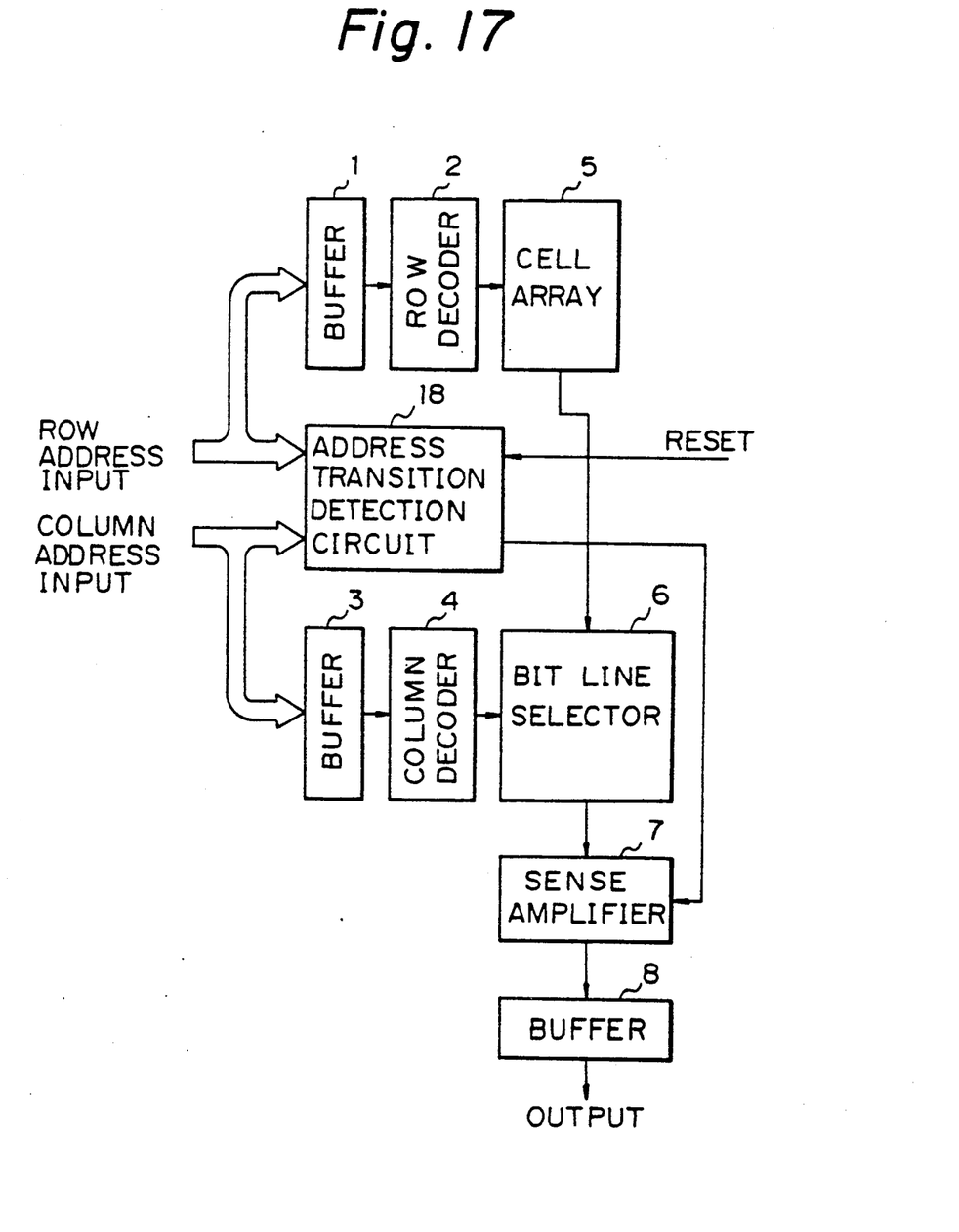
FIG. 17 shows a circuit construction in which the reset circuit is applied to a memory device utilizing an address transition detection circuit (ATD) as an example of a third form of application of the power-on reset circuit.

FIG. 17 shows a circuit construction in which the power-on reset circuit is applied to a memory device utilizing an address transition detection circuit (ATD) as an example of the third embodiment of the power-on reset circuit.

In FIG. 17, an address transition detection circuit 18 is provided for outputting a trigger signal to a sense amplifier 7 by detecting a change in the address signal immediately after the time when the address signal input into the memory device (either the row address signal or the column address signal) is varied.

When a change in the input address is detected as above, the sense amplifier 7 is actuated by a trigger signal and the actuated state of the sense amplifier 7 is maintained so that the data corresponding the address after the change can be read out from the cell array 5 through the sense amplifier 7.

Further, the circuit shown in FIG. 17 is constructed in such a way that even when electric power is applied thereto when the input address signal has been previously set, the address transition detection circuit 18 can be actuated by the reset pulse RESET output from the power-on reset circuit of the present invention.

Accordingly, even if electric power is applied thereto when the address input signal has been previously set, the trigger signal is still transmitted from the address transition detection circuit 18 to the sense amplifier 7 and thereby the data corresponding to the address previously set can be read out by actuating the sense amplifier immediately after the trigger signal is input thereto.

I claim:

1. A power supply potential rising detection circuit comprising:

first and second power supply terminals;
   a load element;
   a transistor having a control gate and a floating gate, said transistor being connected in series with said load element between said first and second power supply terminals;
   means for supplying a first potential to said control gate of said transistor, said first potential being dependent on the power supply potential at said first power supply terminal and said transistor being turned On in response thereto; and
   a switching element operatively connected between said floating gate and said second power supply terminal and controlled by a second potential, said second potential being dependent on said power supply potential, and said switching element being turned ON in response thereto and after a predetermined period has elapsed from when said transistor is turned ON for reducing the potential of said floating gate and turning off said transistor when said power supply potential reaches a predetermined value and thereby outputting a power supply potential rising detection signal from the series connection point between said load element and said transistor.

2. A power supply potential rising detection circuit according to claim 1, wherein said switching element is an enhancement type metal insulator semiconductor (MIS) transistor having a gate to which said second potential is supplied.

3. A power supply potential rising detection circuit according to claim 1, wherein said first potential is said power supply potential.

4. A power supply potential rising detection circuit according to claim 1, wherein said first potential is a divided potential of said power supply potential.

5. A power supply potential rising detection circuit according to claim 1, wherein said second potential is said power supply potential.

6. A power supply potential rising detection circuit according to claim 1, wherein said second potential is a divided potential of said power supply potential.

* * * * *

UNITED STATES PATENT AND TRADEMARK OFFICE
CERTIFICATE OF CORRECTION

PATENT NO. : 5,017,803
DATED : May 21, 1991
INVENTOR(S) : YOSHIDA

It is certified that error appears in the above-identified patent and that said Letters Patent is hereby corrected as shown below:

Col. 1,  line 15, after "detecting" change "a" to --the--;
         line 24, after "circuit" insert --.--.

Col. 2,  line 15, delete "is";
         line 21, change "$t_0$," to --$t_0'$--;
         line 23, change "$t_0$," to --$t_0'$--;
         line 56, delete "on";
         line 61, change "accurate)y" to --accurately--.

Col. 3,  line 21, change "other" to --another--;
         line 34, change "FIG." to --FIGS.--, and change "show a" to --are--.

Col. 4,  line 9, change "FC" to --FG--;
         line 21, change "V × 0" to --V = 0--;
         line 29, after "example" insert --,--, and change "$0.5 = V_{cc}$" to --$0.5 \times V_{cc}$--.

Col. 5,  line 19, after "to the" insert --respective--;

Col. 6,  line 31, change "Or" to --OR--;
         line 45, after "$a_j$" insert --,--;
         line 58, after "$a_i$" insert --,--, and after "respectively" insert --,--.

Col. 7,  line 18, after "for" insert --the--;
         line 30, delete "of" (second occurrence);
         line 33, change "signal a" to --signal $a$--;
         line 45, change "signal a" to --signal $a$--;
         line 49, after "N2" insert --to--.

UNITED STATES PATENT AND TRADEMARK OFFICE
CERTIFICATE OF CORRECTION

PATENT NO. : 5,017,803

DATED : May 21, 1991

INVENTOR(S) : YOSHIDA

It is certified that error appears in the above-identified patent and that said Letters Patent is hereby corrected as shown below:

Col. 8, line 6, change "output, signal a" to --output signal $a$,--;
line 14, change "signal a" to --signal $a$--;
line 18, change "and" to --;--;
line 27, change "signal a" to --signal $a$--;
line 30, change "signal a" to --signal $a$--;
lines 39-40, change "mulfunctional" to --malfunctional--.

Col. 9, line 16, change "On" to --ON--.

Signed and Sealed this

Sixth Day of July, 1993

Attest:

MICHAEL K. KIRK

*Attesting Officer*     Acting Commissioner of Patents and Trademarks